United States Patent [19]

Hwang et al.

[11] Patent Number: 5,661,080
[45] Date of Patent: Aug. 26, 1997

[54] METHOD FOR FABRICATING TUNGSTEN PLUG

[75] Inventors: Sung Bo Hwang; Keun Yook Lee, both of Kyoungki-do, Rep. of Korea

[73] Assignee: Hyundai Electronics Industries Co., Ltd., Kyoungki-do, Rep. of Korea

[21] Appl. No.: 164,960

[22] Filed: Dec. 10, 1993

[30] Foreign Application Priority Data

Dec. 10, 1992 [KR] Rep. of Korea ............ 92-23778

[51] Int. Cl.[6] .............................. H01L 21/283
[52] U.S. Cl. .................. 438/654; 257/763; 438/656; 438/628
[58] Field of Search ............ 437/189, 190, 437/192, 228 T, 246; 257/752, 753, 763

[56] References Cited

U.S. PATENT DOCUMENTS

| | | | |
|---|---|---|---|
| 5,407,698 | 4/1995 | Emesh | 427/99 |
| 5,420,074 | 5/1995 | Ohshima | 437/193 |
| 5,489,552 | 2/1996 | Merchant et al. | 437/192 |
| 5,573,978 | 11/1996 | Cho | 437/192 |

*Primary Examiner*—T. N. Quach
*Attorney, Agent, or Firm*—Reid & Priest LLP

[57] ABSTRACT

A method for fabricating a tungsten plug in a contact hole by depositing a tungsten film of a predetermined thickness several times to form a multilayer structure, thereby increasing the density of the tungsten plug. The method includes the steps of forming an insulating film over a conductive layer, removing a predetermined portion of the insulating film and thereby forming a contact hole through which the conductive layer is partially exposed, forming a glue layer over the entire exposed surface of the resulting structure including the contact hole and the exposed surface of the insulating film, depositing a blanket tungsten film to a small thickness over the glue layer, depositing a seed layer to a small thickness over the blanket tungsten film, sequentially depositing another blanket tungsten film and another seed layer over the seed layer and repeating the sequential deposition until the resulting structure fills the contact hole completely, and etching back the blanket tungsten films and seed layers disposed over the insulating film so that they remain only in the contact hole.

6 Claims, 1 Drawing Sheet

1

METHOD FOR FABRICATING TUNGSTEN PLUG

BACKGROUND OF THE INVENTION

1. Field of the Invention

The present invention relates to a method for fabricating a tungsten plug in a contact hole of a highly integrated semiconductor device, and more particularly to a method for fabricating a tungsten plug by using several tungsten film deposition steps capable of obtaining a tungsten plug with a high density.

2. Description of the Prior Art

In fabrication of a multilayer wiring of a highly integrated memory device or a logic device, an upper metal wiring is in contact with a lower conductive layer through a contact hole formed in an insulating film to have a vertical shape so that it is connected with the lower conductive layer. An increased integrity of such device results in an increase in aspect ratio (the ratio of height to width) of the contact hole. As a result, the step coverage of an upper layer deposited may be deteriorated. The contact hole may be incompletely filled with a metal layer used as the upper layer. These phenomenons cause a problem of an increase in contact resistance.

For solving such problem, a proposal for the use of a contact plug made of a metal layer filling the contact hole has been made.

For fabricating such a contact plug, an insulating layer is formed over a lower conductive layer comprised of, for example, a silicon layer or a metal layer. A predetermined portion of the insulating layer is then etched, thereby forming a contact hole. Over the entire exposed surface of the resulting structure, a blanket tungsten layer is thickly deposited. The tungsten layer is then etched back at its portion disposed over the remaining insulating film so that it remains only in the contact hole. Thus, a contact plug is obtained.

However, the blanket tungsten layer thickly deposited as mentioned above may have a low density resulting in key holes in the tungsten plug. Furthermore, the tungsten layer may have a rough surface, so that subsequent steps may be unstably performed.

SUMMARY OF THE INVENTION

Therefore, an object of the invention is to provide a method for fabricating a tungsten plug in a contact hole by depositing a tungsten film of a predetermined thickness several times to form a multilayer structure, thereby increasing the density of the tungsten plug.

Another object of the invention is to provide a method for fabricating a tungsten plug in a contact hole by forming a multilayer structure comprising of tungsten films and seed layer for enhancing the condition for deposition of tungsten, thereby increasing the density of the tungsten film disposed over the seed layer.

In accordance with the present invention, this object can be accomplished by providing a method for fabricating a metal plug, comprising the steps of: forming an insulating film over a conductive layer, removing a predetermined portion of said insulating film and thereby forming a contact hole through which said conductive layer is partially exposed; forming a glue layer over the entire exposed surface of the resulting structure including said contact hole and said exposed surface of the insulating film; depositing a first blanket tungsten film to a small thickness over said glue layer; depositing a first seed layer to a small thickness over said first blanket tungsten film; sequentially depositing a second blanket tungsten film and a second seed layer over said seed layer and repeating the sequential deposition until the resulting structure fills the contact hole completely; and etching back said first and second tungsten films and said first and second seed layers disposed over the insulating film so that they remain only in the contact hole.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 4 are pictorial schematic sectional views respectively illustrating a method for fabricating a tungsten plug in accordance with the present invention.

Figure 1:
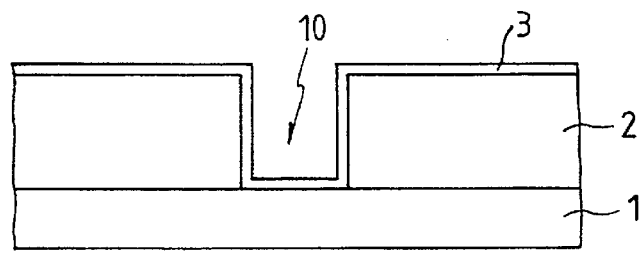
FIGS. 1 to 4 are schematic sectional views respectively illustrating a method for fabricating a tungsten plug in accordance with the present invention.

In accordance with this method, an insulating layer 2 such as a silicon oxide film is formed over a lower conductive layer 1 comprised of, for example, a silicon layer or a metal layer formed on a wafer, as shown in FIG. 1. Using a contact mask (not shown), the insulating layer 2 is etched at a contact region, thereby forming a contact hole 10. A glue layer 3 such as a TiN (Titanium Nitride) film is deposited over the entire exposed surface of the resulting structure including the exposed insulating layer 2 and the contact hole 10, by use of a sputtering process or a chemical vapor deposition process.

Figure 2:
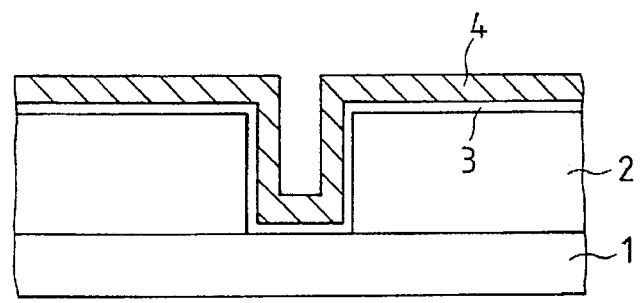

Thereafter, a first blanket tungsten film 4 is deposited over the glue layer 3 in a reactor of a tungsten deposition equipment injected with a gas of $WF_6$ and $H_2$, as shown in FIG. 2. The deposition of the first blanket tungsten film 4 is achieved so that the already formed first tungsten film 4 has a thickness (t) corresponding to the value obtained by dividing the total thickness (T) of a blanket tungsten film to be obtained, by the number of predetermined deposition steps (n).

Figure 3:
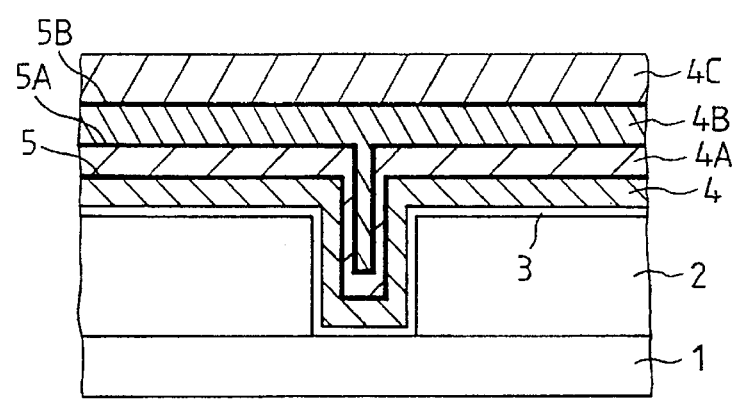

After the deposition, the wafer with the first blanket tungsten film is carried to a vacuum chamber from the reactor and then cooled down to an ambient temperature. Thereafter, the wafer is put into the reactor again. Under this condition, an $SiH_4$ gas is added in an amount of 1 to 100 SCCM (Standard Cubic Centimeter) into the gas of $WF_6$ and $H_2$ for the deposition of the blanket tungsten film, so that a first seed layer 5 is formed over the first blanket tungsten film 4, as shown in FIG. 3. This step is sequentially repeated for forming a second blanket tungsten film 4A, a second seed layer 5A, a third blanket tungsten film 4B, a third seed layer 5B and a fourth blanket tungsten film 4C over the first seed layer 5.

Figure 4:
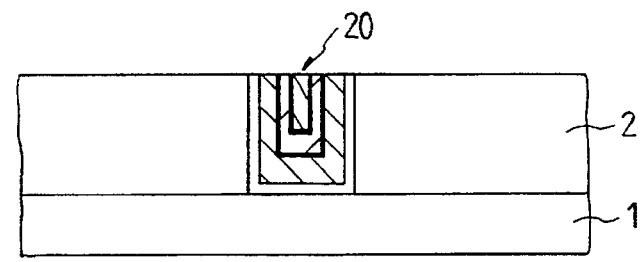

Subsequently, an etch-back step is carried out, as shown in FIG. 4. The etch-back step is achieved by etching the first, the second, the third and the fourth blanket tungsten films 4, 4A, 4B and 4C, the first, the second and the third seed layer 5, 5A and 5B and the glue layer 3 until the upper surface of the insulating layer 2 is exposed. By this etch-back step, a tungsten plug 20 is formed. The tungsten plug 20 is constituted of the portions of the glue layer 3, the first, the second, and the third blanket tungsten films 4, 4A and 4B and the first and the second seed layer 5 and 5A buried in the contact hole 10. The etch-back step is performed in a fluorine-based plasma.

In accordance with another embodiment of the present invention, the formation of seed layers may be eliminated. In this case, after completion of the formation of the glue layer 3 over the contact hole 10 and the insulating layer 2 as shown in FIG. 1, blanket tungsten films are deposited several times over the glue layer 3 in a reactor of a tungsten deposition equipment injected with a gas of $WF_6$ and $H_2$. It is noted that this embodiment comprises the steps of depositing a first blanket tungsten film to a predetermined thickness (t) corresponding to the value obtained by dividing the total thickness (T) of a blanket tungsten film by the number of predetermined deposition steps (n), carrying the wafer to a vacuum chamber and then cooling it to an ambient temperature, depositing a second blanket tungsten film to the predetermined thickness (t) over the first blanket tungsten film under a condition that the wafer has been put into the reactor, and then sequentially forming a third blanket tungsten film and a fourth blanket tungsten film over the resulting structure in the above-mentioned manner.

Although no seed layer is interposed between the blanket tungsten films in accordance with this embodiment, the tungsten density of a tungsten plug finally obtained is increased over those of the conventional cases.

As apparent by shown from the above description, in accordance with the present invention blanket tungsten films are repeatedly deposited for forming a tungsten plug. In accordance with the present invention, a seed layer is interposed between blanket tungsten films. As a result, it is possible to reduce the size of tungsten crystals in the tungsten film and increase the tightness of the tungsten film. These effects prevent a formation of key holes in the tungsten plug finally obtained. The surface roughness of the tungsten plug is also-reduced. As a result, there is no problem associated with the subsequent steps.

Although the preferred embodiments of the invention have been disclosed for illustrative purposes, those skilled in the art will appreciate that various modifications and additions are possible, without departing from the scope and spirit of the invention as disclosed in the accompanying claims.

What is claimed is:

1. A method for fabricating a metal plug, comprising the steps of:

forming an insulating film over a conductive layer, removing a portion of said insulating film and thereby forming a contact hole through which a surface of said conductive layer is partially exposed;

forming a glue layer over the insulating film and the partially exposed surface of said conductive layer;

depositing a first blanket tungsten film over said glue layer;

depositing a first seed layer for enhancing the deposition of tungsten over said first blanket tungsten film;

sequentially depositing a second blanket tungsten film and a second seed layer over said first seed layer and repeating the sequentially deposition until the resulting structure fills the contact hole completely; and etching back the blanket tungsten films and said first and second seed layers disposed over the insulating film so that they remain only in the contact hole.

2. A method in accordance with claim 1, further comprising steps of carrying a wafer deposited with said first blanket tungsten film to a vacuum chamber, then cooling said wafer to an ambient temperature before depositing said second blanket tungsten film.

3. A method in accordance with claim 1, wherein said step of depositing said first seed layer is achieved using $WF_6$ and $H_2$ gases combined with 1 to 100 sccm $SiH_4$ gas.

4. A method for fabricating a metal plug, comprising the steps of:

forming an insulating film over a conductive layer, removing a portion of said insulating film and thereby forming a contact hole through which a surface of said conductive layer is partially exposed;

forming a glue layer over the insulating film and the partially exposed surface of said conductive layer;

depositing a first blanket tungsten film over said glue layer;

sequentially depositing second, third, and fourth blanket tungsten films over said first blanket tungsten film to completely fill the contact hole; and etching back the blanket tungsten films disposed over the insulating film so that they remain only in the contact hole.

5. A method in accordance with claim 5, further comprising the steps of carrying a wafer deposited with said first, second or third blanket tungsten film, respectively, to a vacuum chamber, then cooling said wafer to an ambient temperature before depositing said second, third or fourth blanket tungsten film, respectively.

6. The method of claim 4, wherein the first, second, third and fourth blanket films form a tungsten film having a thickness, T, and each of said first, second, third and fourth tungsten films have a thickness of T/4.

* * * * *